United States Patent [19]

Brown et al.

[11] Patent Number: 5,365,657
[45] Date of Patent: Nov. 22, 1994

[54] METHOD AND APPARATUS FOR CUTTING WIRE

[75] Inventors: Jerald L. Brown, Huntington; Vaironis Berzins, Hicksville, both of N.Y.

[73] Assignee: Advanced Interconnection Technology, Islip, N.Y.

[21] Appl. No.: 12,011

[22] Filed: Feb. 1, 1993

[51] Int. Cl.⁵ .................... H01K 3/10; B23P 19/00
[52] U.S. Cl. ........................... 29/850; 29/745; 156/433; 228/4.5
[58] Field of Search ............ 156/433; 228/4.5; 29/850, 852, 745

[56] References Cited

U.S. PATENT DOCUMENTS

| | | | |
|---|---|---|---|
| 3,674,602 | 7/1972 | Keough et al. | 156/433 |
| 3,674,914 | 7/1972 | Burr . | |
| 4,415,115 | 11/1983 | James | 228/4.5 X |
| 4,437,603 | 3/1984 | Kotoyashi et al. | 29/850 X |
| 4,619,397 | 10/1986 | Urban et al. | 228/4.5 X |
| 4,641,773 | 2/1987 | Morino et al. . | |
| 4,693,778 | 9/1987 | Swiggett et al. | 156/433 X |
| 4,790,069 | 12/1988 | Maruyama et al. | 29/832 |

FOREIGN PATENT DOCUMENTS 248055 10/1990 Japan .................... 228/4.5
705714 12/1979 U.S.S.R. .................. 29/850

*Primary Examiner*—Carl J. Arbes
*Attorney, Agent, or Firm*—Morgan & Finnegan

[57] ABSTRACT

An improved cutting apparatus and method used in a wire scribing device, said cutting apparatus having a cutter blade attached to a wiring head, and having a z-axis actuator for precisely controlling the movement of the cutter blade in the z-direction. A gauge height finder, attached to the wiring head determines a distance between the wiring head and the substrate, wherein the determined distance is used to control the z-axis actuator for lowering the cutter blade so as to precisely cut the conductor on the surface of the substrate. Furthermore, the cutting apparatus may include a cutter bracket attached to the wiring head, having a preloaded spring fixed thereto. Wherein this spring is preloaded to a preset force and wherein the spring is positioned above the cutter blade so that an upward force on the cutter blade is transmitted to the spring.

26 Claims, 10 Drawing Sheets

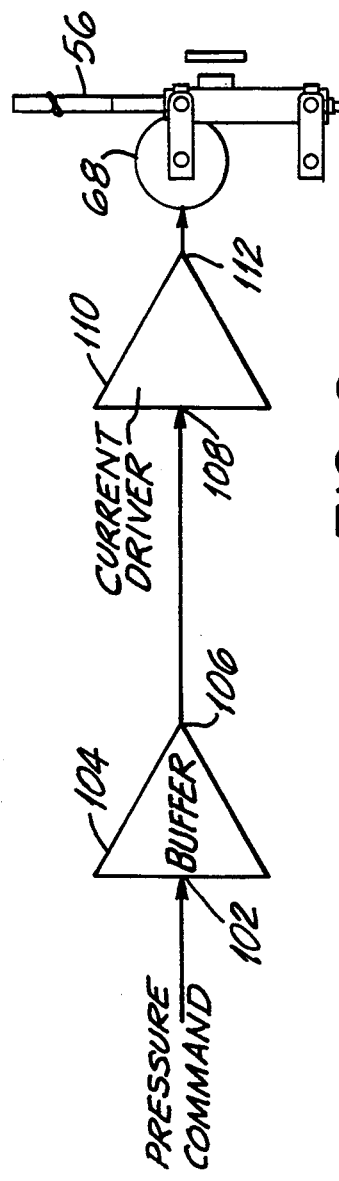
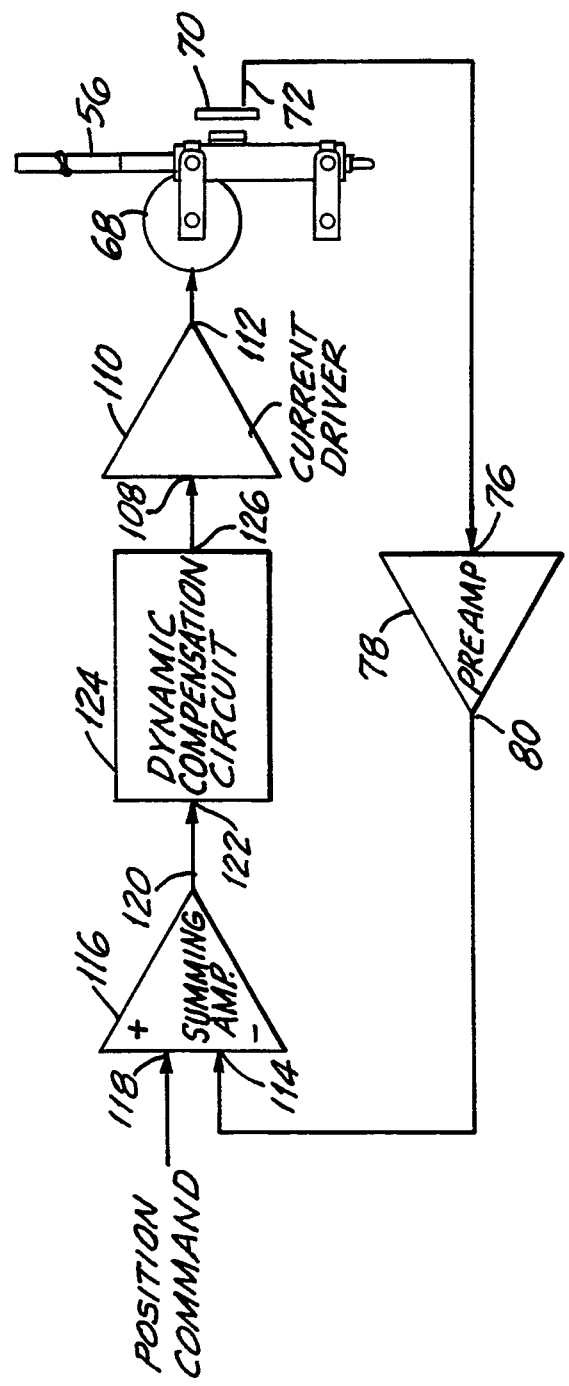
FIG. 8
FIG. 9

METHOD AND APPARATUS FOR CUTTING WIRE

Field of the Invention

The present invention relates to the production of wire scribed circuit boards, and more specifically, to an improved cutting apparatus used in a device for scribing a conductor to the surface of a substrate.

BACKGROUND OF THE INVENTION

Wire scribed circuit boards have become an alternative to, or may be used in conjunction with, printed circuit boards. Wire scribed circuit boards are produced by machines which bond conductors to the surface of a substrate, such as a fiberglass circuit board. The conductors are typically insulated wires of various diameters, which are applied to the surface of the circuit board in a predetermined pattern to create circuits.

The typical scribing machine has a wiring head suspended above a circuit board affixed to the surface of a table. The wiring head and circuit board move relative to each other in the horizontal x and y directions, and the vertical z-direction. Furthermore, the wiring head may rotate about the z-axis with respect to the board during turns in a conductor's path along the board.

A typical wiring head performs several functions, including guiding and feeding the conductor, bonding the conductor, and cutting the conductor. A continuous filament of the desired conductor is stored within the scribing apparatus. During processing, the conductor is despooled and fed from the wiring head onto the surface of the board. The conductor is bonded to the board by various means. For example, in one bonding technique the conductor contacts the board underneath a stylus extending down from the wiring head. The stylus transmits ultrasonic vibrations into the conductor and the circuit board activating an adhesive film on the board's surface, and causing the conductor to bond to the surface of the circuit board. Frequently, an adhesive material is applied on both the conductor and the circuit board.

Initially, the conductor follows a predetermined path as it is fed and bonded to the board. The path may include straight lines, turns, or crossing over other previously bonded conductors. At the end point, the conductor is cut. This sequence is repeated to produce the desired circuit pattern having many discrete conductor segments.

After scribing the entire circuit board, electrical connections are made to the conductor ends. Various techniques have been used. For example, holes are drilled into the circuit board at the desired locations, cutting through the insulated wire so that the exposed end of the conductor becomes part of the hole wall. The holes are then metallized, and the end of the conductor is electrically connected to the metal-plated hole.

U.S. Pat. Nos. 3,674,914 and 4,693,778 generally disclose apparatus for writing or scribing conductors onto circuit boards. Within the wiring head, a feeder mechanism feeds wire into a wire guide, which guides the wire to the surface of the board. As wire is guided beneath the tip of a stylus, the stylus exerts a downward force as it helps bond the wire to the board. A cutting blade for severing the wire is located between the end of the wire guide and the stylus.

These prior apparatus typically handled conductor wire of about 7 mils diameter. The holes receiving the conductors and for mounting the components were typically about 46 mils. With the advent of surface mounted components, the diameters of holes decreased sharply, and as a result, small wire sizes, about 2.5–4 mils in diameter, came into use. Although smaller diameter holes and wires permitted increased component and wiring densities, scribing machines were not designed to handle the smaller diameter wires and experienced problems during operation. In particular, these prior scribing machines had problems associated with their process and mechanism for cutting wires.

At the termination of a wire segment it must be cut. Such cutting is typically done by bringing a sharp blade across the wire. Initially, this cutting action was performed at the surface of the circuit board. In other words, the wire was pinched in between the blade and the surface of the board. Such a cutting technique is described in U.S. Pat. No. 3,674,914.

Cutting on the surface of the board has the advantage of being able to precisely place the end of the wire. Wire scribing systems lay wires in exact locations according to electronically stored position data. Thus, the cutting blade can be placed directly over the location on the board where the wire should be terminated. A cut, at this point, leaves the wire in a precisely known location.

The cutting mechanism, for cutting on the board surface, is important and must provide a cutting edge that cleanly and completely severs the wire. If the cut is shallow and does not extend through the diameter of the wire, the conductor could be pulled from its bonded location as the wiring head moves to the next site. Conversely, if the cut is deep, then the blade cuts into the circuit board, damaging the circuit board, dulling the blade, and possibly deforming the blade into the shape of a shovel-like lip. A dull and deformed blade not only may fail to cut wires, but also may lift the bonded wire off the board as the blade is retracted.

Cutting small diameter wires requires even greater precision. High density wire scribing results in small diameter wires being placed extremely close to each other. In order to cut only a single wire at a time, blade widths of 15 mils or less are needed, requiring precise cutting action so as not to damage the blades. Previous on board cutting mechanisms did not have to cope with small wire problems. The large blades and solenoid controlled cutting action of these prior devices provided excessive forces during cutting, making such cutting mechanisms unacceptable even for larger wire designs.

As a result of these problems, cutting techniques shifted from cutting wires on the circuit board to cutting wires above the board. The new cutting techniques prevented damage to the circuit boards and blades, but created other problems. First, it was now no longer possible to know the exact position where the wire end would be placed on the board. Second, these scribing machines could not scribe a very short segment of wire following a 90° turn in the wire direction. Third, wire damage occurred when the stylus was stopped prior to reaching the wire end. Fourth, an initial feed mechanism was required.

Wire end placement error includes three sources: ultrasonic elongation, intervening crossovers, and stylus-to-cutter height variations.

Ultrasonic elongation occurs when the stylus presses down on the wire causing the wire to elongate. The elongation not only introduces wire placement error, but also increases the dc resistance of the wire and makes the wire more susceptible to damage from the hammering force of an ultrasonic stylus. Elongation can be minimized by maintaining feeder control of the wire as it is delivered from the wiring head. If the wire is cut above the circuit board then the feeder no longer controls the wire as it passes beneath the stylus and elongation becomes a problem.

A crossover is created when a wire being scribed traverses on top of and over a wire previously scribed. When a wire is cut above the circuit board, an exactly determined amount of unbonded wire must be allowed for, in order for the wire end to precisely extend to the desired termination point on the circuit board. This amount is computed to correspond to the linear distance from the stylus tip to the end point. After wire cutting, the stylus bonds the remaining wire, ideally up to the desired end point. However, when the cut is made, their may be a crossover intervening along the path to the end point. In this case, the remaining wire not only must cover the linear distance from the stylus to the end point, but also must traverse the intervening crossover. As a result, the wire end is positioned short of the desired location.

Uncertain wire end placement also occurs when the distance between the cutter and the stylus tip varies. This distance determines the remaining length of wire to be bonded to the board's surface. Height variations in the z-direction of the circuit board cause the stylus to follow this profile. Unless the stylus and cutter are displaced together, the resulting fluctuations in the length of wire remaining to be bonded, causes the wire end to come up short or to overshoot the desired location on the circuit board.

A further problem with existing systems is their inability to produce short ends following a turn. Two factors cause this problem. First, the length of remaining unbonded wire following a cut is about 47 mils. Second, during a turn the wire has a tendency to slip out from beneath the stylus unless it has some form of directional control. Such control is normally provided by the wire guide.

After a wire is cut and has left the wire guide, directional control of the wire is lost so that no turns may be made in the wire remaining to be scribed. In existing systems this situation occurs as soon as the wire is cut, because the cutter is mounted onto the end of the wire guide. Hence, the remaining unbonded wire is positioned in a straight line and the minimum length of wire following a turn is fixed at about 47 mils.

In the current era of high density component packing, the above limitations have serious consequences. The closely spaced holes and minimum clearances required between wires and holes place a maximum length limitation on wire ends following turns. Furthermore, it is undesirable for the wire end to overshoot its intended termination point by even small amounts because the cut end may be overlapped by a subsequent wire. Then, in the presence of excessive ultrasonic action from the stylus, the wire end, which may be sharp, can damage the insulation of the top wire and result in a "short". Unnecessary, unbonded wire portions are generally problematic and should be avoided. Optimally, ends, following turns, of less than 20 mils are desired.

A further problem exists with current cutting methods. The stylus must stop about 47 mils from the desired wire end location to make the cut. The stylus then moves to bond the remaining wire. Occasionally, the stylus stops for the cut on top of a crossover. This increases the chances for wire damage.

As a result of the above described cutting method, current wiring heads must provide an initial feed mechanism. After a particular wire segment has been completely bonded to the board, there is no wire under the stylus to start the next wire. Thus, a mechanism must be provided for dispensing an initial feed of wire.

Solutions to some of these problems were attempted, such as by decreasing the cutter-to-stylus distance. Yet, these solutions were not successful and led to great mechanical complexity rendering it impractical to manufacture the wiring head.

SUMMARY OF THE INVENTION

It is therefore an object of the present invention to provide an improved cutting apparatus in a device for scribing a conductor to the surface of a substrate which eliminates the problems attendant with cutting wire at a location not on the circuit board's surface.

A further object of the invention is to eliminate problems attendant with cutting on the circuit board's surface such as cutting into the fiberglass circuit board or damaging the cutter blade.

The present invention is a method and apparatus for cutting conductors on the circuit board, thereby eliminating problems such as wire end placement error, inability to produce short ends following a turn, wire damage due to stylus stopping, and the initial feed.

The invention provides an improved cutting apparatus which meets this and other objectives.

In the invention a cutter blade is attached to the wiring head. A precise determination is made of the distance from the cutting edge to the top of the conductor, at the conductor segment's end point. A z-axis actuator then lowers the cutter blade in accordance with the determined distance so as to precisely cut the conductor on the board's surface.

In a preferred embodiment of the invention, the cutter is a small blade positioned next to a stylus tip. The blade is fixed to the wiring head. The cut is performed by moving the entire wiring head, along with the cutter blade, downward. The wire is pinched between the blade and the underlying panel and thus severed.

The circuit board height in the z-direction frequently varies across the board. It is therefore desirable to determine, at each conductor segment's end point, the distance from the cutting edge to the top of the conductor. With this distance determination, a precise cut on the circuit board's surface may be made.

Such distance determination is preferably performed with the aid of a stylus in contact with the top of the conductor but may be performed by any of various techniques well known in the art. The stylus is suspended from the wiring head and is capable of motion in the z-direction relative to the wiring head. The vertical displacement between the stylus and the wiring head, from an initial calibrated position, is detected by a z-axis sensor. A signal from the z-axis sensor is sent to a z-axis actuator, that controls the raising and lowering of the cutter blade. It is thus possible to control the exact depth of the cut so that the blade passes completely through the conductor without damaging the fiberglass panel underneath.

In a preferred embodiment, the z-axis actuator lowers the wiring head to a preestablished height above the top of the conductor, at the end point. Then, since the spatial relationship between the cutting edge and the wiring head is known, the z-axis actuator lowers the cutter blade so as to precisely cut the conductor.

In the invention, the cutter blade is mounted onto a cutter bracket from which it may be removed and replaced upon the wearing of the blade. Such mounting is preferably compliant but may be fixed. In a fixed mounting configuration it is desirable that the cutter blade not travel downward past the surface of the circuit board or deeper than the layer of adhesive film used in some bonding methods. Compliant mounting ensures that even if the cutter blade contacts the circuit board, neither board nor blade will be damaged.

The method of the invention produces a cut conductor end bonded to the circuit board. This method may be used to place the conductor end precisely at any point on the circuit board. The first step in performing the cut is to control the conductor bonding so that no portion of conductor following the end point will be bonded to the surface of the board. Next, the height of the cutter blade above the conductor at the end point is precisely determined. The cutter blade is placed directly over the end point. Then, utilizing the determined height, the cutter blade is lowered to make the cut on the circuit board's surface. The cutter blade is raised and the cut is complete.

In a preferred embodiment, an additional step is performed after the cut is made. The unbonded conductor, that is fed out of the wiring head, is moved a short horizontal distance away from both the end point and the freshly cut end of the bonded conductor segment. This step assures that the unbonded conductor is truly separated from the cut and from the adhesive.

Another embodiment includes an additional step following the cut. The stylus is moved a small distance back toward the end point. This assures that the end of the unbonded conductor is entirely beneath the stylus tip. Thus, the starting portion of the next conductor segment will be fully bonded to the board.

A further aspect of the invention ensures a smooth transition before the wiring head is positioned over the start of the next conductor segment. Prior to moving to the start of the next conductor segment, the cutter blade and the entire wiring head must be raised to a sufficient height above the circuit board so that there is no unintentional contact with previously scribed wires or previously mounted components. It is important during this positioning mode for the conductor end under the stylus tip to stay in substantial contact with the stylus tip. If the stylus and conductor end are not raised uniformly then the wire has a tendency to slip out from underneath the stylus tip and may require manual repositioning.

The stylus is suspended to allow vertical movement relative to the wiring head. The position or downward force of the stylus is controlled by a stylus actuator. During conductor scribing, the stylus actuator provides a specified downward force to the conductor. During positioning mode, however, the stylus actuator receives a signal from the z-axis sensor causing the stylus to maintain a fixed position relative to the wiring head as the wiring head is being raised. Thus, the conductor, supported by the wiring head, is raised in substantial lock-step with the stylus.

BRIEF DESCRIPTION OF THE DRAWINGS

The invention will be described in greater detail below by way of reference to the following drawings, wherein:

FIG. 8 is a block diagram of the stylus' pressure control mode.

FIG. 9 is a block diagram of the stylus' position control mode.

DETAILED DESCRIPTION OF THE DRAWINGS

Figure 1:
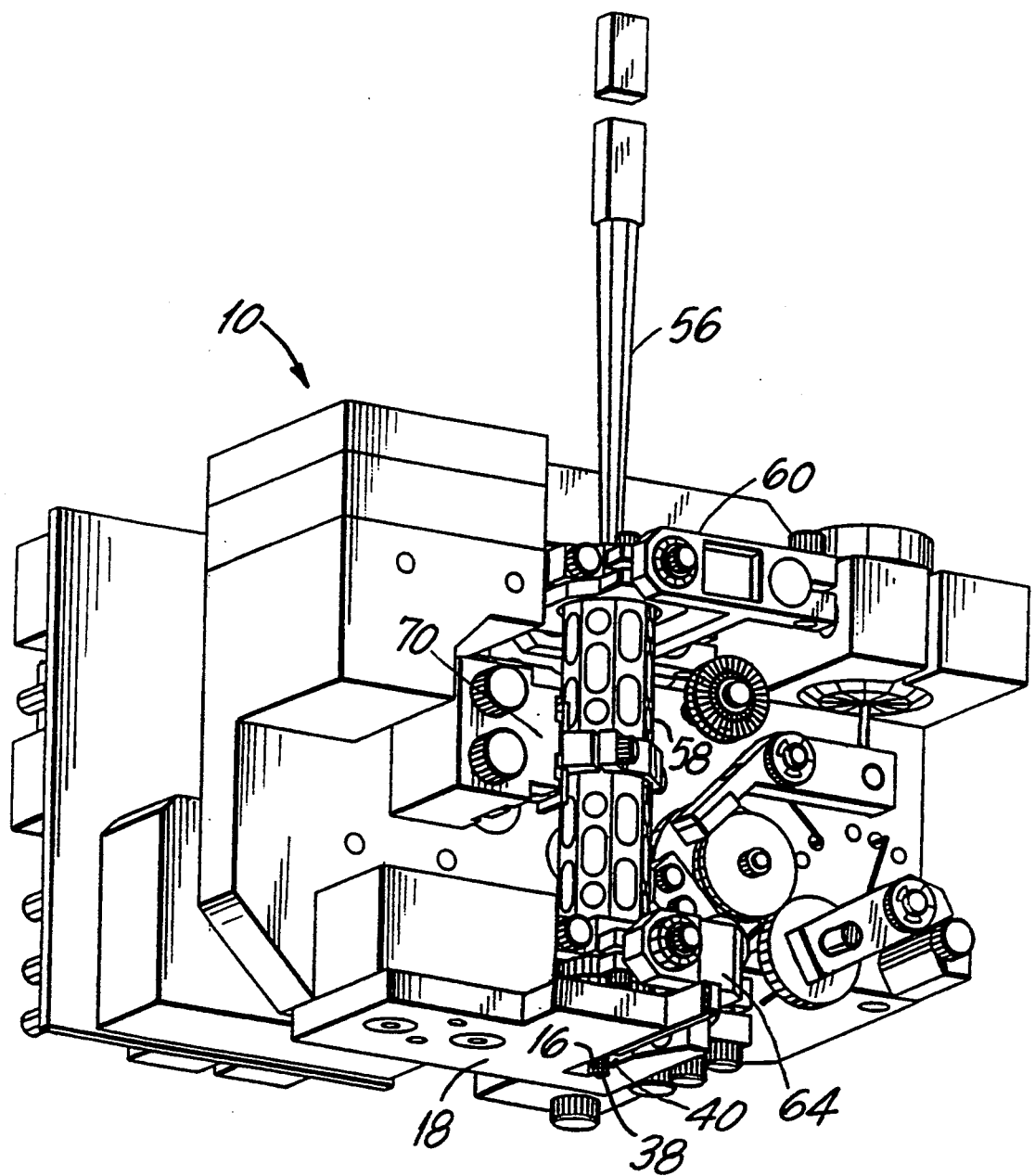
FIG. 1 is a perspective view of a wiring head embodying the apparatus of the instant invention.
Figure 2:
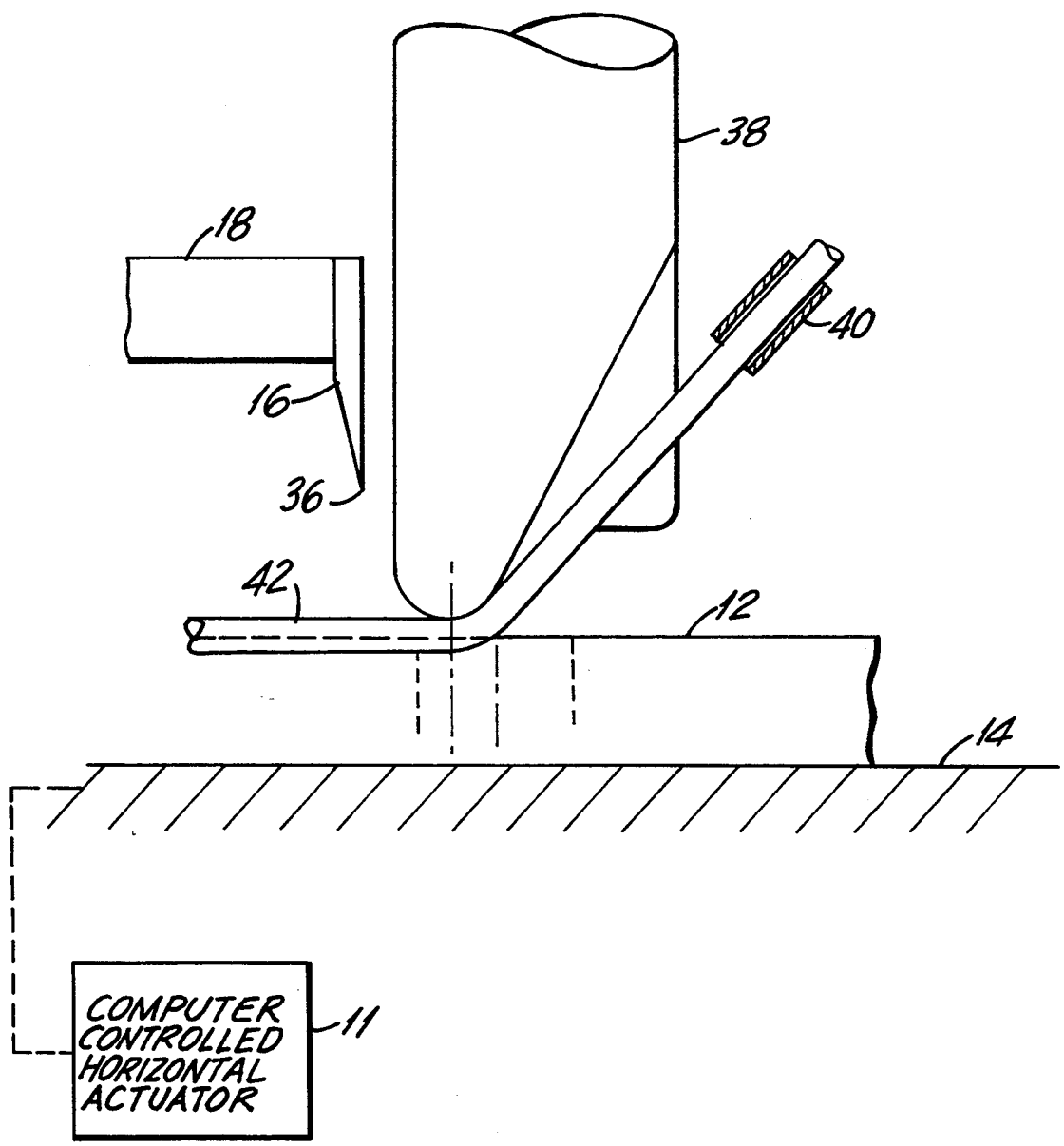
FIG. 2 is a schematic view of the region around the stylus tip during a scribing operation.

Referring to the drawings of FIGS. 1 and 2, the apparatus of the instant invention has a wiring head 10 supported above a substrate 12. The substrate 12, supported and fixed to a platform or table 14, moves in the x-direction, the y-direction, or a combination of the x-direction and y-direction, with respect to the wiring head 10. Such motion may be produced by any of various horizontal actuators well known in the art. Preferably, the table 14 moves with respect to a stationary wiring head 10 but a movable wiring head and a stationary table is also possible. Also preferably, the table motion is controlled by a computer 11 programmed to perform functions including: locating the starting and end points, locating the path the conductor segments will follow, and carrying out the steps required in a cutting operation.

Figure 3A:
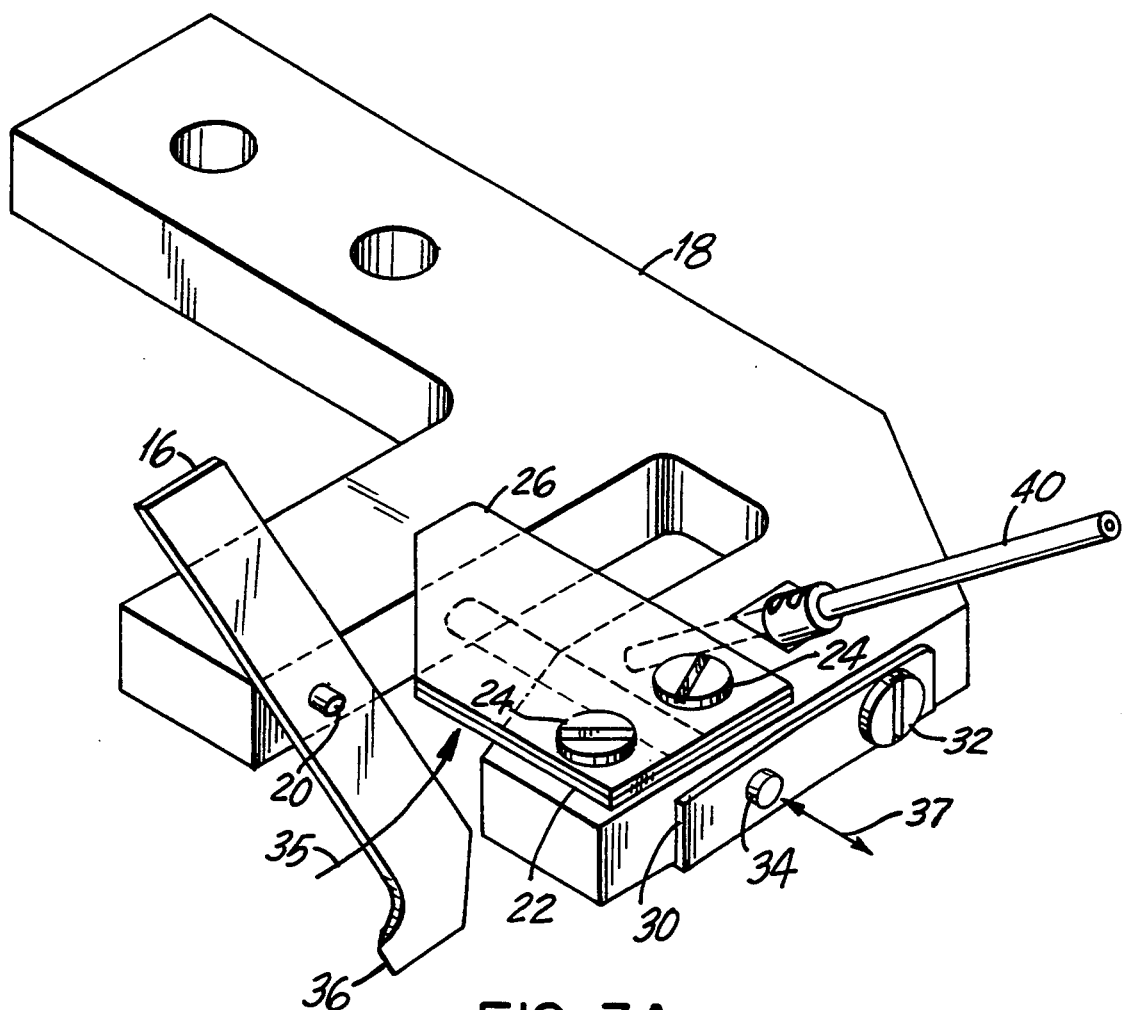
FIGS. 3A-3C are conceptual perspective illustrations of the compliant mounting of the cutter blade and its operation.
Figure 3B:
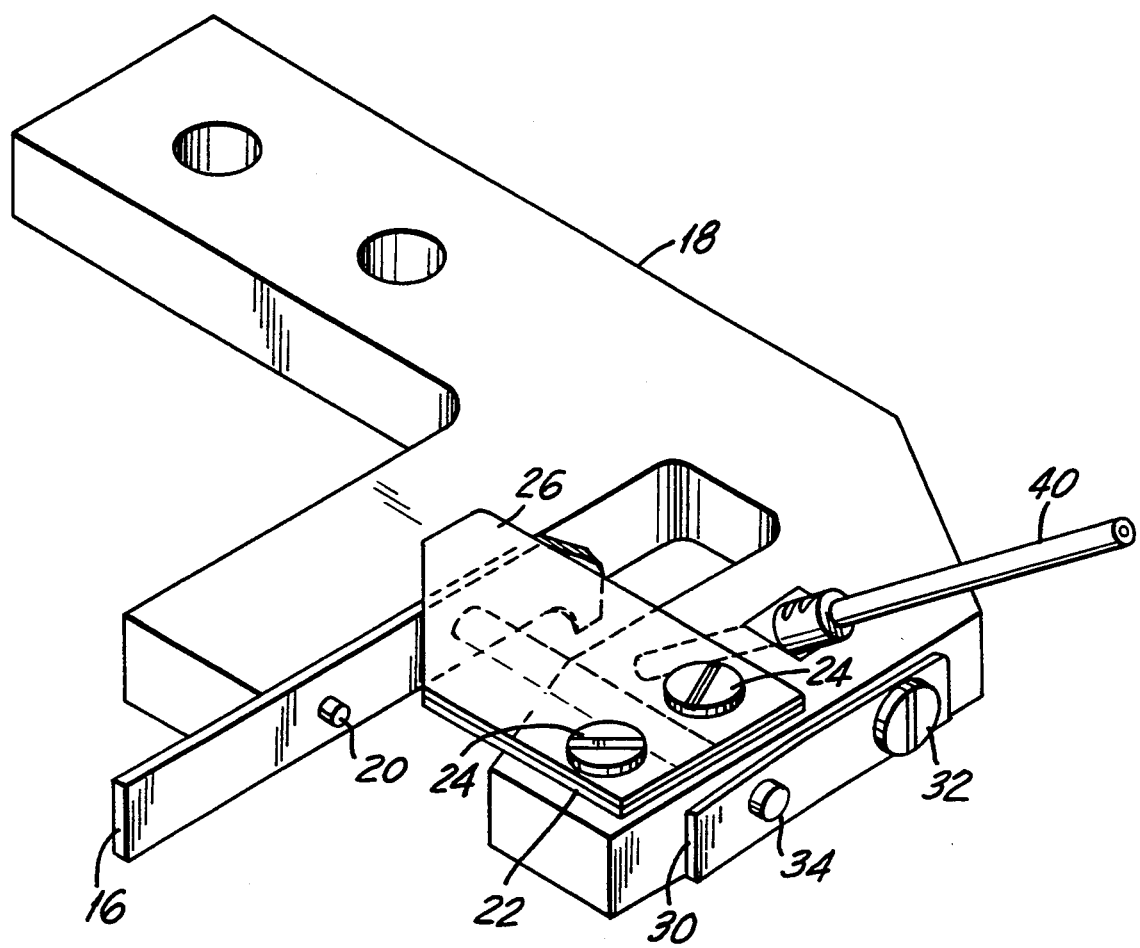
Figure 3C:
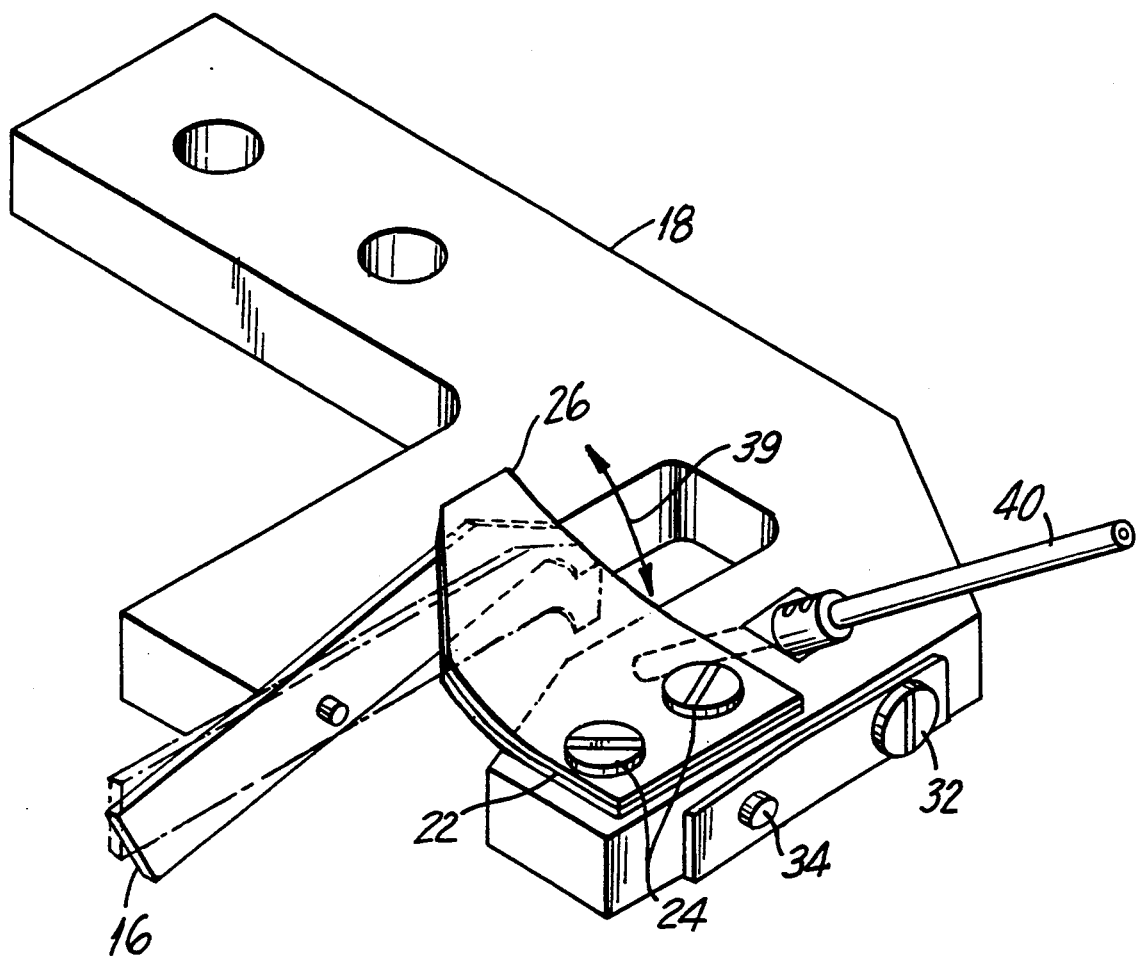
Figure 4:
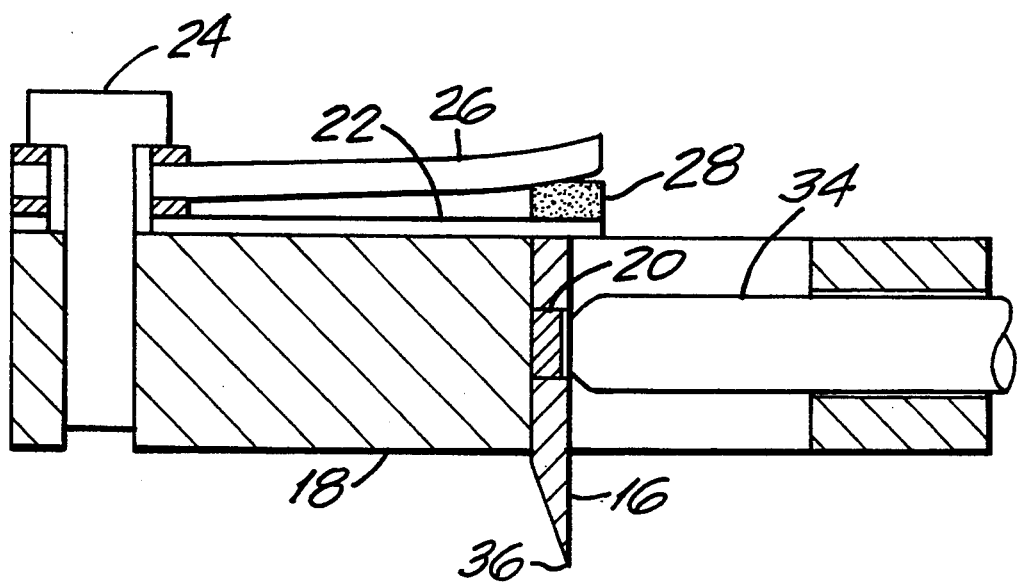
FIG. 4 is a schematic cross sectional side view of the cutter bracket illustrating the compliant mounting of the cutter blade.

A preferred embodiment, illustrated in FIGS. 3A-3C, 4 and 5, includes a cutter blade 16 that is compliantly mounted to a cutter bracket 18. Cutter blade 16, preferably made of tool steel, is mounted on pivot pin 20 that is fixed to cutter bracket 18. Flat spring 22 is fixed on top of cutter bracket 18 by two screws 24 so that it is positioned above cutter blade 16. Spacer 28 is fixed to the top of flat spring 22. Preloaded flat spring 26 is also fixed to cutter bracket 18 by two screws 24 and is in contact with spacer 28. Push pin spring 30 is fixed to the side of cutter bracket 18 by screw 32 and pushes against push pin 34. Push pin 34 passes through and is movably supported by cutter bracket 18. Cutter blade 16 is laterally supported by cutter bracket 18 on one side and by push pin 34 on the other. FIG. 3A shows the initial mounting of a cutter blade 16 mounted on the pivot pin 20. The cutter blade 16 is rotated upwardly against the bottom of flat spring 22, as indicated by arrow 35. The push pin 34 is adjusted to accommodate and hold the cutter blade 16 in place, as indicated by arrow 37. This procedure is repeated whenever a new cutter blade 16 is needed. A properly mounted cutter blade 16 is shown in FIG. 3B. FIG. 3C illustrates the compliant cutter operation. If the cutting force, namely the upward force on the cutting edge 36, is less than the preload value, as it should be during a normal cutting sequence, then the flat springs 22, 26 remain unflexed and the cutter blade 16 stays in its normal position throughout the cut. On the other hand, if the cutting force exceeds the preload value, then the flat springs 22, 26 flex upward with the cutter blade 16 rising beneath it, as indicated by arrow 39. Such action alleviates the forces between the cutter blade 16 and the substrate 12 and prevents either from becoming damaged.

Compliant mounting is desirable for at least two reasons. First, wires are sometimes applied to both sides of a circuit board. When the second side is being wired, the board is resting on the wires of the first side. This leaves some areas of the board without support. If the board is very thin, about 1/32 inch, the vertical pressure of the cutter blade may cause the board to deflect. In this case, such deflection may prevent the cutting force from getting large enough to penetrate the wire. Thus, the cutter blade must be further lowered possibly resulting in contact between the blade and the board.

Second, considerable care is needed to set up a rigidly mounted cutter blade. The cutting edge 36 should be within ±/−0.5 mil of the proper distance from the bottom of the stylus tip 38 when the cut begins. Such a tight tolerance is not a problem when wiring the second side of thin boards because the force on the cutter blade will be relieved by the board deflection. But, for the first side of thin boards and for either side of a thick board the consequence of a poor setup will be large forces which can blunt or break the cutter blade.

Figure 5:
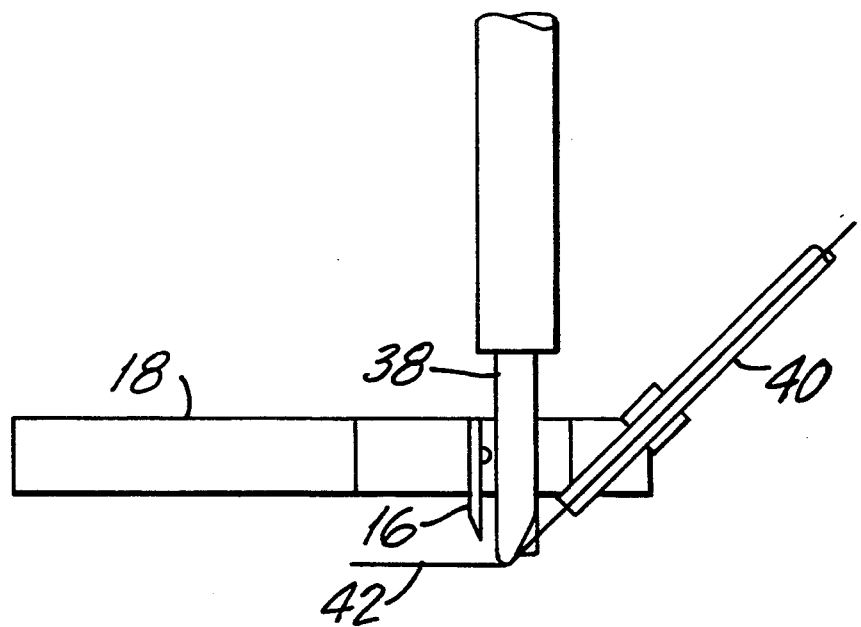
FIG. 5 is a schematic side view of the cutter bracket and its alignment with other wiring head features

In a preferred embodiment, the cutter bracket 18 is fixed to the wiring head 10. In addition, as shown in FIG. 5, the wire guide 40 is fixed to and passes through the cutter bracket 18 so that there is perfect alignment during scribing between the conductor 42, the stylus tip 38, and the cutter blade 16. It should be noted that in other embodiments, the cutter blade 16 and bracket 18 need not be fixedly attached to the wiring head 10 but may be capable of independent vertical motion with respect to the wiring head. Furthermore, the instant invention encompasses a configuration where the cutter blade 16 is fixedly mounted to the cutter bracket 18.

Figure 6:
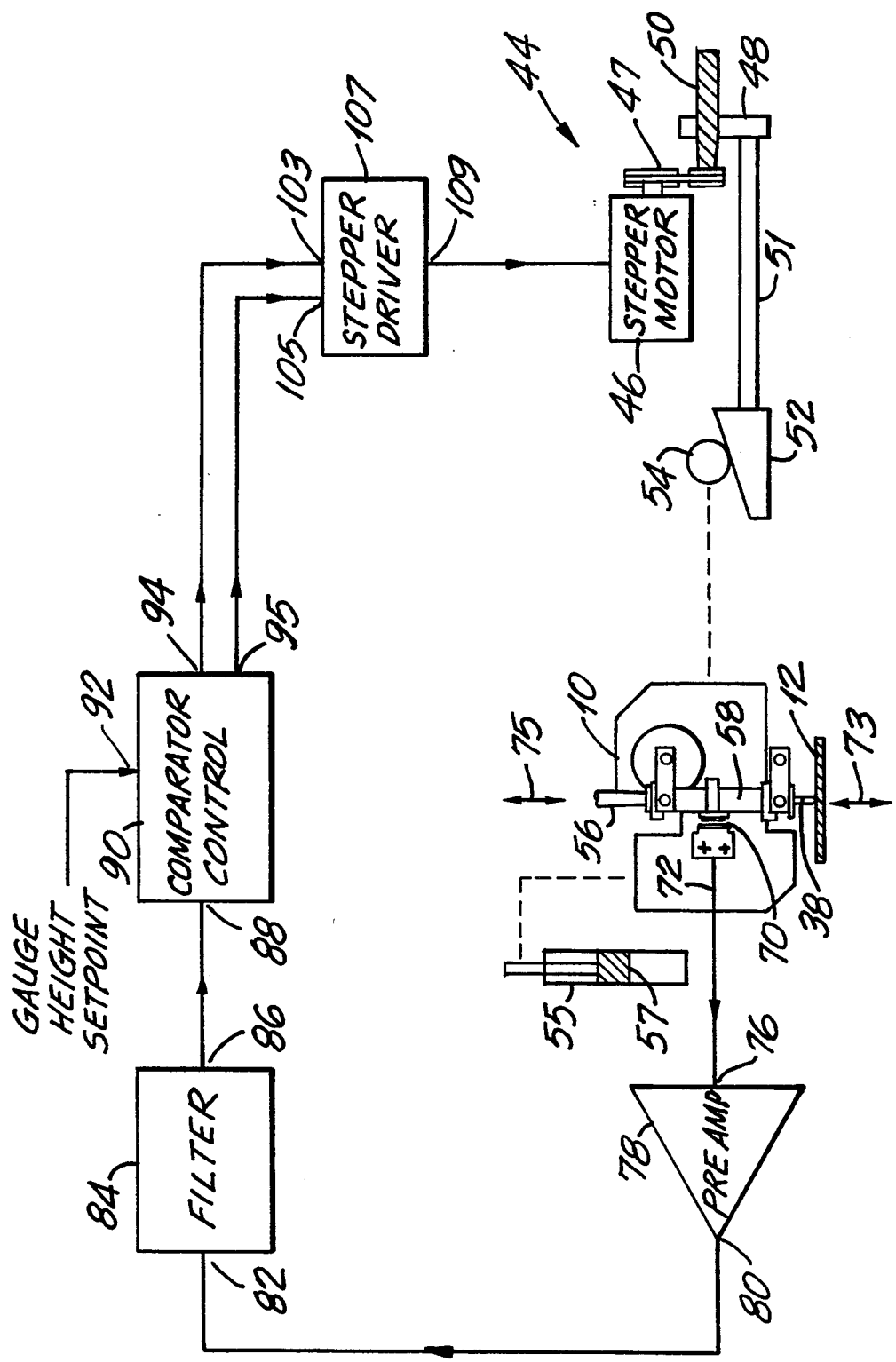
FIG. 6 is a block diagram illustrating the gauge height controller.

A z-axis actuator 44, shown schematically in FIG. 6, raises and lowers the wiring head 10 along with the cutter blade 16, shown in FIG. 1, in response to various signals depending on the function the z-axis actuator 44 is performing. In a preferred embodiment the z-axis actuator 44 includes a stepper motor 46 that is capable of moving the wiring head 10 and the cutter blade 16 in discrete steps of about 0.1 mil. The stepper motor 47 is preferably a model no. LA23GCK-210 made by Eastern Air Devices and driven by a stepper driver 107 model no. D200 made by Eastern Air Devices. The stepper motor 46 is coupled to ball screw 50 by timing belt drive 47. The stepper motor 46 incrementally rotates ball screw 50 causing ball nut 48 to move horizontally back and forth. Ball nut 48 is connected to shaft 51, which is fixed to wedge 52. Wedge 52 contacts cam follower 54 that is fixed to the wiring head 10 causing the wiring head 10 to move up and down in the z-direction as the wedge 52 moves back and forth. Air cylinder 55 is fixed to the stationary frame of the wiring apparatus. Piston 57 inside of air cylinder 55 is connected to wiring head 10. The downward force on the wiring head 10 is supplied by botch its weight and by a small constant force imparted via piston 57. It should be noted that in other embodiments, the z-axis actuator 44 may control the cutter blade 16 independently of the wiring head 10.

In a preferred embodiment, the apparatus maintains a constant gauge height by adjusting the wiring head's height to compensate for the board's varying profile. Constant gauge height control is accomplished by a gauge height controller that includes a feedback control circuit, shown in FIG. 6. Gauge height refers to the distance between the board's surface and a conveniently chosen reference point on the wiring head 10, such as the lower most point of the wire guide 40 of FIG. 5. The output signal 72 from a z-axis sensor 70 is received by the input 76 of a preamplifier 78. The preamplifier output 80 goes to the input 82 of a filter 84. The filter output 86 is sent to the first input 88 of comparator control 90. The second input 92 of comparator control 90 receives a gauge height setpoint signal that represents a gauge height setpoint. The comparator control's first and second outputs 94, 95 are connected to the first and second inputs 103, 105 of the stepper driver 107. The output 109 of stepper driver 107 is connected to the stepper motor 46.

Figure 7:
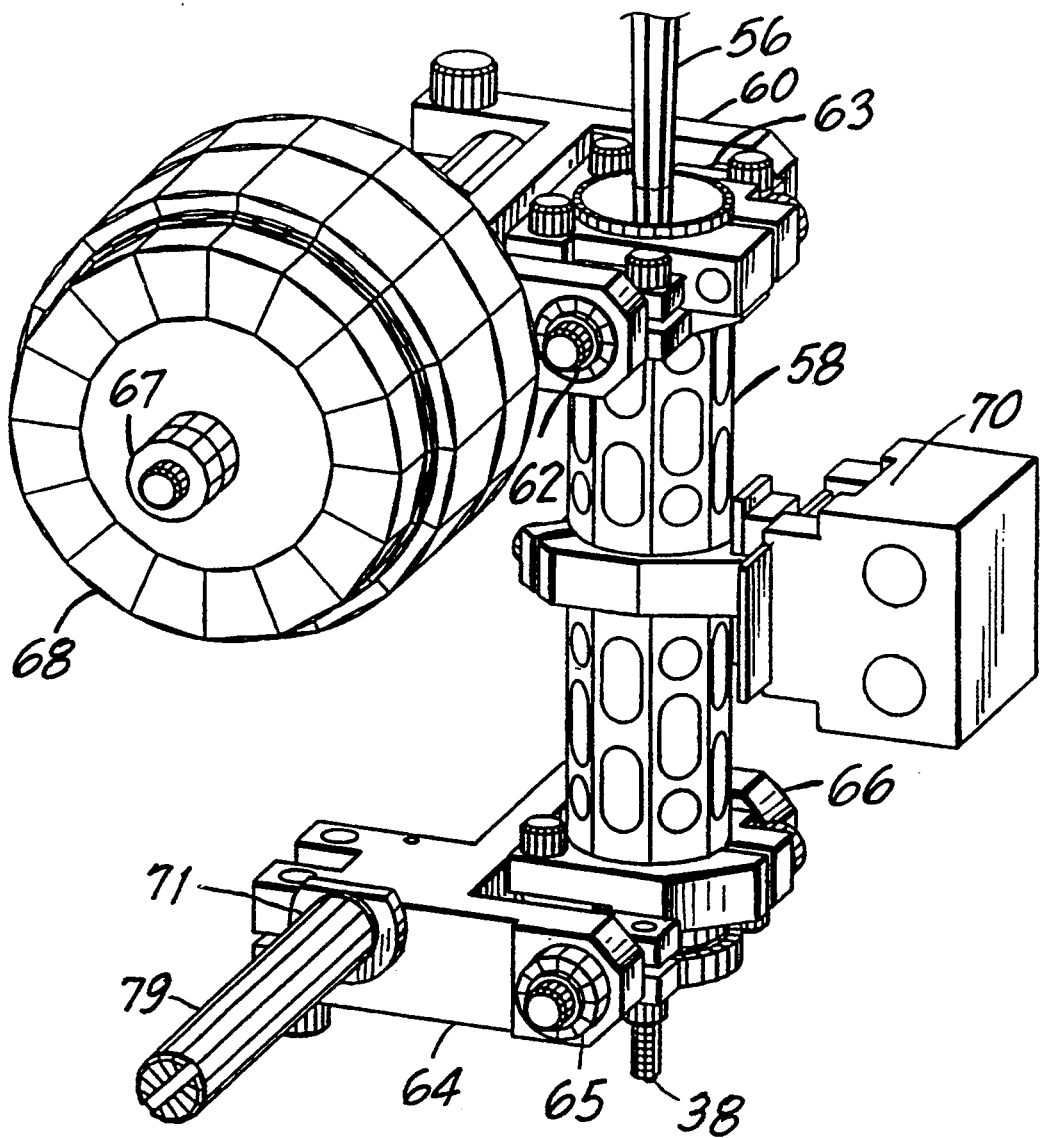
FIG. 7 is a reverse perspective illustration of the stylus suspension and the stylus actuator.

Referring to FIGS. 6 and 7, the z-axis sensor 70 detects relative vertical movement between a stylus 56 and the wiring head 10. The z-axis sensor 70 may be implemented in various ways. Preferably, the sensor 70 consists of a Hall effect sensor fixed to the wiring head 10 and a magnet fixed to a stylus sleeve 58. The Hall effect sensor, preferably a model no. 92SS12-2 made by Microswitch, Division of Honeywell Corp., produces an output signal 72 proportional to the flux of the magnet which in turn provides a measure of the vertical displacement between the stylus 56 and the wiring head 10.

During scribing, as shown in FIG. 2, the conductor 42 is fed from a wire guide 40 fixed to the wiring head 10 down onto the substrate 12 and underneath the stylus tip 38. Since the stylus tip 38 is in contact with the top of the conductor 42 and the bottom of the conductor 42 is in contact with the surface of the substrate 12, the stylus-to-wiring head displacement serves as a measure of gauge height. Thus, as depicted in FIG. 6, changes in the z-direction height of the substrate 12, as indicated by arrow 73, are translated into stylus motion, as indicated by arrow 75, that is detected by the z-axis sensor 70.

The preamplifier 78 amplifies and scales the sensor output 72 so that the preamplifier signal at output 80 has a precise relationship to the gauge height. Preferably the preamplifier 78 contains potentiometers for adjusting the gain and offset imparted to output 72 thus compensating for variations in Hall effect sensor characteristics. The filter 84, an RC network, eliminates signal noise and smoothes out signal changes which are too fast for the z-axis actuator 44. The rate of height adjustment for the z-axis actuator 44 is about 60 mils/sec. This speed is adequate to follow variations in board height. The input stage of the comparator control consists of a comparator, preferably a model no. LTC1040MJ made by Linear Technology Corp. The comparator compares the gauge height signal at the first input 88 with the gauge height setpoint signal at the second input 92. If the gauge height signal represents a gauge height within ±/−1.5 mils of the gauge height setpoint, no control action is taken. When the gauge height signal exceeds these limits the stepper driver 107 is turned on to drive the head 10 either up or down thereby returning it to a position corresponding to the gauge height setpoint. The comparator provides for a hysteresis effect in turning off the stepper motor 46 once it has been turned on. Only when the gauge height signal represents a gauge height within $\pm/-0.5$ mil of the gauge height setpoint will the stepper motor 46 be turned off. The comparator has two outputs that indicate three possible states: do nothing, drive the wiring head upward, drive the wiring head downward. These two outputs go to the second stage of the comparator control, a well known logic network, that converts them into two outputs 94, 95. The first output 94 is a pulse train where each pulse causes the stepper driver 107 to rotate the ball screw 50 a small, discrete amount. The second output 95 controls the direction in which the ball screw 50 rotates.

A constant gauge height may be desirable for various reasons including: staying within the physical operating range of the stylus' suspension; and maintaining a fairly constant geometry for the conductor 42 between the wire guide 40 and the bottom of the stylus tip 38, FIG. 2. In any event, an additional function of the gauge height controller is that it may be used during the cutting operation to set the distance between the cutting edge 36 and the conductor 42. By placing the stylus tip 38 on top of the conductor 42 at the end point and then enabling the gauge height controller, the wiring head 10 and cutter blade 16 will be vertically adjusted to a preestablished height above the top of the conductor 42.

The gauge height setpoint is predetermined taking into consideration the physical geometry of the wiring head 10 and is preferably set so that, referring to FIG. 2, there are about 25 mils from the cutting edge 36 to the bottom of the stylus tip 38, the bottom of the stylus tip 38 corresponding to the top of the conductor 42.

Referring to FIGS. 2 and 6, once the gauge height is set, the z-axis actuator 44 lowers the cutter blade 16 and wiring head 10 the exact distance required for the cutter blade 16 to completely sever the conductor 42 without cutting into the substrate 12. In a preferred embodiment this distance is the 25 mils gauge height, plus the diameter of the wire, plus a very small distance that may bring the cutter blade 16 into an adhesive layer on the surface of the substrate 12, but not into the fiberglass construction of the substrate 12.

In a preferred embodiment, as shown in FIG. 7, a stylus 56, supported in stylus sleeve 58, is pivotally connected to an upper suspension arm 60 by two bearings 62, 63 and to a lower suspension arm 64 by two bearings 65, 66. The upper suspension arm 60 is connected to stylus actuator 68 by bearing 67 and a bearing, not shown, on the opposite side of the stylus actuator 68 as viewed in FIG. 7. Both of these bearings are mounted in the motor housing and the motor's armature rotates with respect to them. The stylus actuator 68 is fixed to the wiring head 10 of FIG. 1. Lower suspension arm 64 is pivotally connected to the wiring head 10 of FIG. 1 by two bearings, neither of which are shown. These two bearings are located within lower suspension arm 64 and rotate about lower suspension shaft 79. Lower suspension shaft 79 is fixed to the wiring head 10. The two bearings connected to lower suspension shaft 79 and also bearing 67 are actually preloaded pairs of bearings that functionally act as one bearing. The stylus tip 38 extends down from the wiring head 10. The stylus suspension operates in a parallelogram fashion, allowing the stylus 56 to move up and down over a limited physical range with respect to the wiring head 10.

A stylus serves one or more of several functions in the wire bonding process. These functions include: guiding the wire along its predetermined path on the circuit board; applying a downward pressure to the wire to aid in bonding; and serving as a medium through which ultrasonic vibrations are transmitted to activate an adhesive material on the board surface, on the wire itself, or both. In the preferred embodiment of the present invention, the stylus 56 also serves as a probe used for determining the gauge height.

It is important to note that the instant invention embodies any of various means for determining the distance between the wiring head 10 and the top of the substrate 12. Further note, that since the diameter of the conductor is known, knowledge of the distance from a point on the wiring head to the top of the conductor is equivalent to knowing the distance from the wiring head to the top of the substrate. The term "gauge height finder" refers to any means for determining the gauge height. For example, the z-axis sensor 70 need not employ the stylus 56 as a probe but may use any other mechanical probe to establish the desired distance. Furthermore, the instant invention encompasses all ways of determining the desired distance including those employing electromagnetic waves, capacitance, and inductance. Further still, a particular embodiment need not maintain a constant gauge height but may use the gauge height finder's information to lower the cutter blade 16 an appropriate distance.

The stylus actuator 68, of FIG. 7, has two modes of operation. Preferably, such modes are implemented with circuitry in a main controller located remotely from the wiring head 10. In one mode of operation, pressure control mode, the stylus 56 is used to apply a downward force to the conductor 42. This is accomplished, as diagrammed in FIG. 8, by sending a pressure command signal to the input 102 of a buffer 104. The buffer output 106 goes to the input 108 of a current driver 110. The signal from the output 112 of the current driver 110 drives the stylus actuator 68 to achieve the desired downward force.

Figure 11:
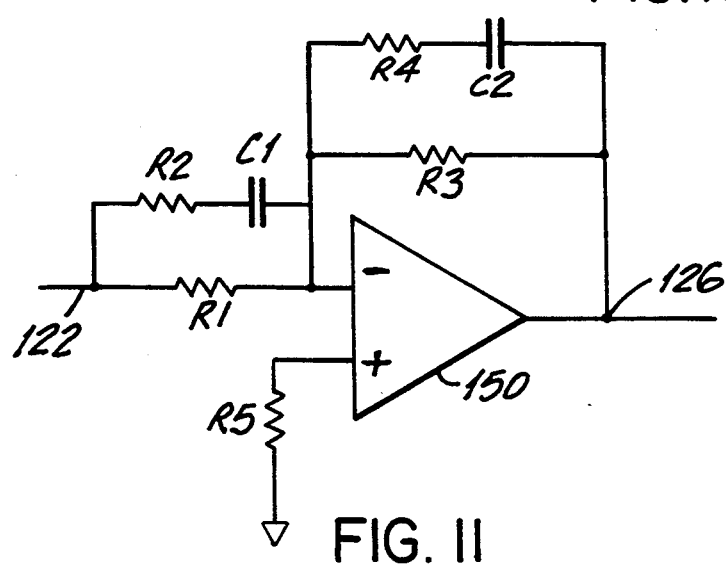
FIG. 11 is a schematic diagram of the dynamic compensation circuit.

In another mode of operation, position control mode, the position of the stylus 56 with respect to the wiring head 10 is controlled by the z-axis sensor 70 and a feedback circuit, shown in FIG. 9. The z-axis sensor's output signal 72 is sent to the input 76 of preamplifier 78. The preamplifier output 80 goes to the inverting input 114 of summing amplifier 116. A position command signal is sent to the noninverting input 118 of summing amplifier 116. In an embodiment utilizing constant gauge height, the position command signal is set at a value that represents a gauge height of about 25 mils. The summing amplifier's output 120 provides an error signal which is sent to the input 122 of a dynamic compensation circuit 124. The dynamic compensation output 126 then goes to the input 108 of a current driver 110. The signal from the current driver output 112 drives the stylus actuator 68. The dynamic compensation circuit 124 is a lead-lag network that prevents the feedback circuit from becoming unstable and oscillating. The lead-lag network is implemented in the conventional fashion shown in FIG. 11, with operational amplifier 150 connected to resistors R1–R4 and capacitors C1 and C2. Particular component values must be uniquely determined for a particular overall wiring head system so as to achieve the desired compensation. However, typical values are as follows:

| COMPONENT | VALUE (R - Ohms; C - Microfarads) |
|---|---|
| R1 | 180K |
| R2 | 20K |
| R3 | 174K |
| R4 | 30.1K |
| R5 | 174K |
| C1 | 0.01 |
| C2 | 0.47 |

The stylus actuator 68 is preferably a limited rotation torque motor. The position control mode, as will be more fully explained later, is used to maintain a fixed relationship between the stylus 56 and the wiring head 10 when the wiring head is raised in between wire scribing.

The method of the invention, of which a preferred embodiment is sequentially illustrated in FIGS. 10A–10F, produces a bonded end 134 on the substrate 12 at the hole center 136. The hole center 136 corresponds to the end point of the conductor segment being bonded. The stylus tip 38 conveys ultrasonic energy to the conductor 42 and to a thin layer of adhesive material on the surface of the substrate 12 as part of the bonding process. Before the center of the stylus tip 38 reaches the hole center 136, the stylus tip 38 is stopped and the ultrasonic power is turned off, FIG. 10A. The stylus tip 38 then continues until it reaches the hole center 136, FIG. 10B. During bonding, the conductor 42 is partially embedded in the adhesive. The conductor 42 emerges from the adhesive over a certain distance measured from the center of the stylus tip 38. Not until the conductor 42 has completely emerged from the adhesive, can the conductor be cut leaving an unbonded end 138 clear and free of the adhesive. It is for this reason, that the ultrasonic power must be turned off a sufficient distance from the hole center 136 to enable the wire to emerge from the adhesive. This distance depends on factors including primarily the physical geometry of the conductor 42. It should be noted that the instant invention encompasses other than continuous bonding procedures such as periodically bonding the conductor 42 to the substrate 12 as the conductor is dispensed. Thus, total bonding of the bonded end 134 is preferable but not necessary.

Figure 10A:
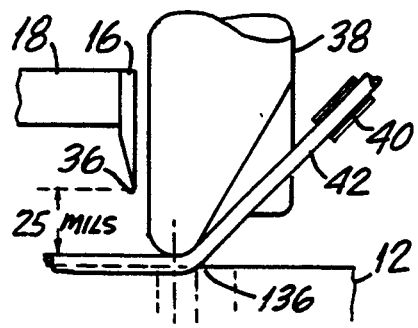
FIGS. 10A-10F are schematic illustrations showing various steps in the cutting sequence of the instant invention.
Figure 10B:
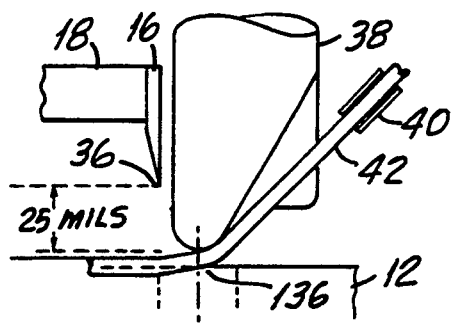
Figure 10C:
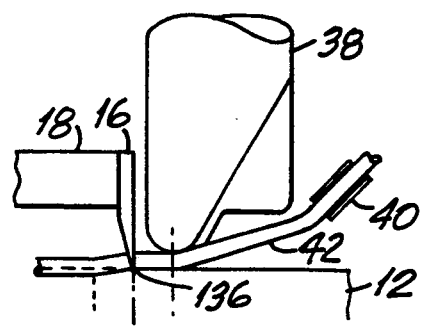

Next, while the center of the stylus tip 38 is positioned over the hole center 136, the gauge height controller, via the z-axis actuator 44, is allowed to set the gauge height, over a span of several millisecond, to the gauge height setpoint. At this stage, the distance from the cutting edge 36 to the top of the conductor 42 is known and has in fact been set at about 25 mils. Then the stylus tip 38 moves so as to position the cutter blade 16 directly over the hole center 136. The cutter blade 16 and the entire wiring head 10 are lowered so as to cut the conductor 42 on the surface of the substrate 12, as shown in FIG. 10C.

Figure 10D:
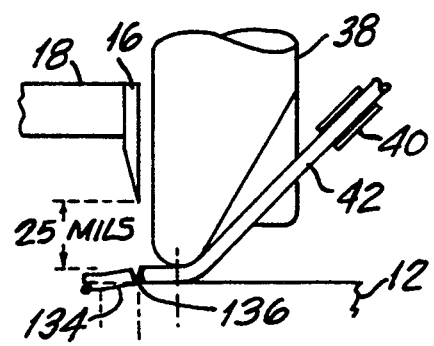

The cutter blade 16 and wiring head 10 are raised and returned to a normal wiring height, again about 25 mils as shown in FIG. 10D. One embodiment of the invention includes an extra step at this point. The stylus tip 38 is moved back on top of the conductor 42 about 5 mils toward the hole center 136. This has the effect of eliminating the tiny portion of conductor 42 at the unbonded end 138 extending beyond the stylus tip 38 toward the hole center 136. Such a step may be desirable for special wiring applications. If necessary a reverse wire feed can take up any small amount of slack in the conductor 42.

Figure 10E:
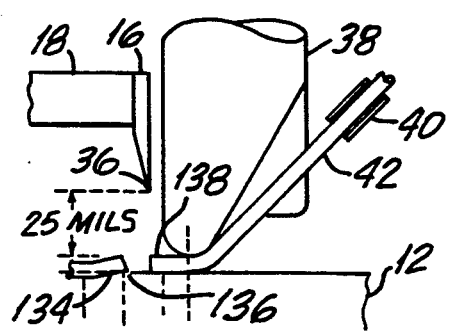

Next, as depicted in FIG. 10E, the stylus tip 38 and the unbonded end 138 beneath it are moved about 5 mils away from the hole center 136. This step ensures that the unbonded end 138 is completely separated from the bonded end 134 and the adhesive, before the stylus tip 38 and the unbonded end 138 are raised off the substrate 12 in the next step.

Figure 10F:
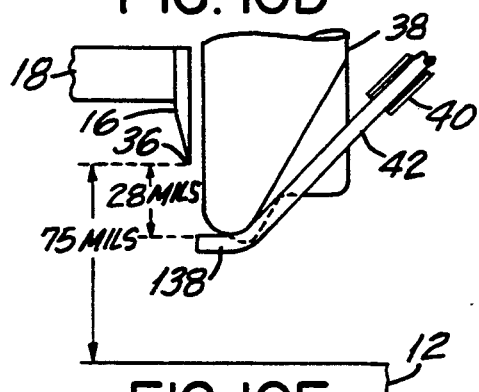

The final step is depicted in FIG. 10F. The stylus actuator 68 is switched to position mode, FIG. 9. The position command signal is set at a value corresponding to a 25 mil gauge height which should be about the actual gauge height at the time the stylus actuator is switched to position mode. The wiring head 10 is raised an additional 50 mils, bringing along with it the stylus tip 38, the wire guide 40, the conductor 42, and the cutter blade 16. The stylus tip 38 is dropped about 3 mils with respect to the wiring head 10. The wiring head 10 is moved to the start of the next conductor segment. As previously discussed, during position control mode the z-axis sensor 70 is used to control the stylus actuator 68. As the wiring head 10 is raised the stylus actuator 68 tries to maintain a 25 mil gauge height and thus the position of the stylus tip 38 with respect to the wiring head 10 is held constant as the wiring head 10 is raised above the substrate 12.

The wiring head 10 is raised 50 mils so that it will not contact previously scribed conductors or previously mounted components on the substrate 12 while it is moving to the next conductor site. Position control mode causes the stylus tip 38 to rise in substantial lock-step with the wiring head 10. Without any support beneath the conductor 42, it has a natural tendency to sag a small amount. To keep the unbonded end 138 beneath the stylus tip 38, the stylus tip is allowed to drop about 3 mils.

It should be expressly understood that the method of the invention should not be construed to be limited solely to the preferred embodiment shown in FIGS. 10A–10F. Any technique for determining the precise vertical distance between the cutting edge 36 and the top of the substrate 12 at the hole center 136, or a point substantially near the hole center, may be used to practice the invention.

In the preferred embodiment of the invention, the z-axis actuator exists primarily for another purpose—following the z-axis contours of the wiring panel during the wiring operation. The z-axis actuator is a very complex and precise subsystem whose expense would be difficult to economically justify if it were for the cutting operation alone. Using the z-axis actuator for the cutting function provides an economical solution for avoiding the problems found in the prior art.

The compliance of the cutter mechanism is a protective feature. This feature provides an economic advantage in that it combines features of blade protection, simple blade attachment and easy blade installation.

Although the invention has been described in detail above by way of reference to the drawings and the preferred embodiment, it should be understood that the invention is not limited to the embodiment described herein, but should be interpreted in accordance with the claims that follow.

I claim:

1. An improved cutting apparatus in a device for scribing a conductor to a surface of a substrate, the device having a wiring head positioned above the substrate and the device having a horizontal actuator for moving the wiring head and the substrate relative to each other in a horizontal direction, wherein the improved cutting apparatus comprises:

- a cutter blade attached to the wiring head;
- a z-axis actuator for precisely controlling the movement of the cutter blade in the z-direction; and
- a gauge height finder attached to the wiring head for determining a distance between the wiring head and the substrate, wherein the determined distance is used to control the z-axis actuator for lowering the cutter blade so as to precisely cut the conductor on the surface of the substrate.

2. The apparatus of claim 1, wherein the gauge height finder includes:

- a probe movably attached to the wiring head so that the probe can move vertically with respect to the wiring head, wherein during scribing, the probe is in contact with the top of the conductor being scribed; and
- a z-axis sensor for determining a vertical displacement between the wiring head and the probe, the determined displacement being used to control the z-axis actuator to lower the cutter blade so as to precisely cut the conductor on the surface of the substrate.

3. The apparatus of claim 2 wherein the probe is a stylus.

4. The apparatus of claim 3 wherein the z-axis sensor is a Hall effect sensor and magnet.

5. The apparatus of claim 2, further comprising, means for driving the z-axis actuator so that the z-axis actuator adjusts the cutter blade to a preestablished height above the surface of the substrate, wherein such means uses the z-axis sensor determination.

6. The apparatus of claim 5, wherein the means for driving the z-axis actuator includes:

- a preamplifier operatively connected to the z-axis sensor for amplifying and scaling the z-axis sensor output;
- a low-pass filter coupled to the preamplifier output;
- a comparator connected to the filter that compares the filter's output with a gauge height setpoint signal, the comparator producing an output signal for activating the z-axis actuator when the filter's output indicates that the gauge height has deviated from the gauge height setpoint; and
- a driver connected to the comparator output that drives the z-axis actuator and accordingly moves the wiring head up and down.

7. The apparatus of claim 3, further comprising, means for raising the stylus and the wiring head above the substrate, in substantial lock-step, such that the tip of the stylus remains substantially in contact with the end of the conductor beneath it.

8. The apparatus of claim 7, wherein the means for raising the stylus and the wiring head above the substrate, in substantial lock-step, includes:

- a stylus actuator connected to the stylus;
- a preamplifier operatively connected to the z-axis sensor for amplifying and scaling the z-axis sensor output;
- a summing amplifier that receives the preamplifier output at its inverting terminal and a position command signal at its noninverting terminal for producing an error signal;
- a dynamic compensation circuit that receives the error signal; and
- a driver connected to the dynamic compensation circuit's output for driving the stylus actuator.

9. The apparatus of claim 1, wherein the z-axis actuator is also used for following z-axis contours of the substrate.

10. The apparatus of claim 1, further comprising a means for compliantly mounting the cutter blade.

11. The apparatus of claim 10 wherein the means for compliantly mounting the cutter blade includes:

- a cutter bracket;
- a first flat spring fixed to the cutter bracket and positioned next to the cutter blade so that an upward force on the cutter blade is transmitted to the first flat spring;
- a second flat spring fixed to the cutter bracket and in contact with the top of the cutter blade;
- a spacer positioned between the first and second flat springs for preloading the first flat spring;
- a pin fixed to the cutter bracket for mounting the cutter blade on the cutter bracket;
- a push pin movably supported by the cutter bracket, where the push pin contacts the side of the cutter blade; and
- a third flat spring fixed to the cutter bracket and contacting the push pin so that it pushes the push pin against the side of the cutter blade.

12. The apparatus of claim 1 wherein the z-axis actuator includes:

- a ball screw;
- a stepper motor coupled to the ball screw for rotating the ball screw;
- a ball nut movably fitted to the ball screw;
- a wedge, having a sloped surface, connected to the ball nut for movement therewith; and
- a cam follower fixed to the wiring head, wherein the cam follower is in contact with the wedge surface for moving the wiring head and the cutter blade in the z-direction.

13. An improved cutting apparatus in a device for scribing a conductor to a surface of a substrate, the device having a wiring head positioned above the substrate and the device having a horizontal actuator for moving the wiring head and the substrate relative to each other in a horizontal direction, wherein the improved cutting apparatus comprises:

- a cutter blade;
- a cutter bracket attached to the wiring head;
- a preloaded spring fixed to the cutter bracket, wherein the spring is preloaded to a preset force and wherein the spring is positioned above the cutter blade so that an upward force on the cutter blade is transmitted to the spring;
- a vertical support attached to the cutter bracket for vertically stabilizing the cutter blade while allowing vertical movement of the cutter blade against the spring with respect to the cutter bracket;
- a lateral support attached to the cutter bracket for laterally stabilizing the cutter blade; and
- a z-axis actuator for controlling the movement of the cutter bracket and the cutter blade in the z-direction.

14. The apparatus of claim 13, wherein the preloaded spring includes:

- a first flat spring fixed to the cutter bracket and positioned next to the cutter blade so that an upward force on the cutter blade is transmitted to the first flat spring;

a second flat spring fixed to the cutter bracket and in contact wit the top of the cutter blade; and a spacer positioned in between the first flat spring and the second flat spring, for preloading the first flat spring.

15. The apparatus of claim 13 wherein the vertical support includes a pin fixed to the cutter bracket for rotatably mounting the cutter blade on the cutter bracket.

16. The apparatus of claim 13 wherein the lateral support includes:

a push pin movably supported by the cutter bracket, wherein the push pin contacts the side of the cutter blade; and a third flat spring fixed to the cutter bracket and contacting the push pin so that it pushes the push pin against the side of the cutter blade.

17. A method for cutting a conductor on a surface of a substrate, comprising the following steps:

(a) guiding and bonding the conductor along a predetermined path up to a predetermined end point, while discontinuing the bonding action at a point sufficiently distant from the end point so that no portion of the conductor is bonded to the surface of the substrate at any point beyond the end point;

(b) determining a precise vertical distance between a cutter blade positioned above the conductor and the top of the substrate at a point substantially near the end point;

(c) lowering the cutter blade in accordance with the determined distance so as to cut the conductor on the substrate at the end point; and (d) raising the cutter blade above the substrate.

18. The method of claim 17, wherein the point substantially near the end point is the actual end point.

19. The method of claim 18, wherein the conductor is a wire that transmits electric current.

20. The method of claim 19, wherein step (b) includes the steps of:

(a) positioning a tip of a probe on top of the wire at the end point; and (b) determining a vertical distance between the cutter blade and the tip of the probe.

21. The method of claim 20, wherein the probe is a stylus.

22. The method of claim 21, wherein step (b) further comprises the step of adjusting the height of the cutter blade to a preestablished vertical distance above the substrate.

23. The method of claim 22, further comprising, after raising the cutter blade, the step of: separating the unbonded wire from the bonded wire at the end point by moving the wire horizontally away from the newly bonded wire's cut end.

24. The method of claim 23, further comprising, before the step of separating the wires, the step of: positioning the stylus a short distance back in the direction toward the end point, so as to eliminate the small amount of wire extending beyond the tip of the stylus.

25. The method of claim 24, further comprising the step of: raising a stylus, which during scribing has its tip in contact with the top of the wire, substantially in lock-step with the raising of the wiring head, while the stylus, wire, and cutter blade are being positioned over the starting point of the next wire segment, so that the tip of the stylus remains substantially in contact with the end of the wire beneath it.

26. The method of claim 25, wherein the step of discontinuing the bonding includes stopping the stylus and turning off the ultrasonic energy transmitted through the stylus before the stylus reaches the end point.

* * * * *